(12) United States Patent
Edwards

(10) Patent No.: US 6,861,892 B1
(45) Date of Patent: *Mar. 1, 2005

(54) LOAD-GENERATED DRIVE, SUBSTANTIALLY NO QUIESCENT CURRENT, TECHNIQUES AND CIRCUITS FOR HIGH SPEED SWITCHING OF TRANSISTORS

(75) Inventor: Karl Edwards, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/350,552

(22) Filed: Jan. 22, 2003

Related U.S. Application Data

(63) Continuation of application No. 09/397,629, filed on Sep. 15, 1999, now Pat. No. 6,531,909.

(51) Int. Cl.[7] .............................................. H03K 17/04
(52) U.S. Cl. ....................... 327/374; 327/376; 327/377
(58) Field of Search ........................ 327/108–112, 374, 327/376, 377, 427, 432, 434, 436, 478, 482, 486, 488, 490, 491, 483, 574, 575, 485, 487, 489, 170, 774; 326/89–91, 17, 18, 20, 19, 26, 27

(56) References Cited

U.S. PATENT DOCUMENTS

| | | | |
|---|---|---|---|
| 4,779,013 A | 10/1988 | Tanaka ........................ 326/27 |
| 5,045,807 A * | 9/1991 | Ishihara et al. ................ 326/89 |
| 5,091,664 A | 2/1992 | Furuhata ...................... 327/574 |
| 5,218,238 A | 6/1993 | Nonaka et al. .............. 327/530 |
| 5,406,144 A | 4/1995 | Houston ....................... 327/513 |
| 5,576,654 A | 11/1996 | Shu et al. ..................... 327/433 |
| 5,648,734 A | 7/1997 | Tanabe et al. ............... 326/115 |
| 5,684,427 A | 11/1997 | Stoddard et al. ............ 327/483 |
| 5,760,618 A | 6/1998 | Deliyanniedes et al. .... 327/108 |
| 6,531,909 B1 * | 3/2003 | Edwards ...................... 327/374 |

OTHER PUBLICATIONS

Linear Technology Data Sheet for LT117A/LT317A, LM117/LM317, pp. 4–137 to 4–144, 1989.
International Solid–State Circuit Conference (ISSCC) Convention 1990, Session 16, p. 250, Steve Pietkiewicz.
Portion of LT1613 1.4MHz, Single Cell DC/DC Converter in 5–Lead SOT–23, Dec. 1998.
Data Sheet for LT 1611, 1998.

* cited by examiner

*Primary Examiner*—Long Nguyen
(74) *Attorney, Agent, or Firm*—Fish & Neave IP Group Ropes & Gray LLP; Joel Weiss; Jeffrey C. Aldridge

(57) ABSTRACT

Techniques and circuits for high speed switching of transistors are provided. These techniques and circuits switch an output device while varying the drive current to the output device in proportion to the output current through the output device. In addition, these techniques and circuits provide a switching circuit with substantially no quiescent currents. This is accomplished by sampling the output current conducted by the output device and using the sample as a signal to drive either the output device fully ON or to switch the output device fully OFF.

58 Claims, 4 Drawing Sheets

LOAD-GENERATED DRIVE, SUBSTANTIALLY NO QUIESCENT CURRENT, TECHNIQUES AND CIRCUITS FOR HIGH SPEED SWITCHING OF TRANSISTORS

This is a continuation of application Ser. No. 09/397,629, filed Sep. 15, 1999 (CPA filed Feb. 6, 2001) (now U.S. Pat. No. 6,531,909). This prior application is hereby incorporated by reference herein in its entirety.

BACKGROUND OF THE INVENTION

This invention relates to switching circuits. More particularly, this invention relates to switching circuits having independent source and sink components.

One conventional method of switching ON an output circuit, e.g., the output transistor of a switching regulator, is to drive its base high with a fixed current source coupled to Vcc. After the circuit is switched ON, an anti-saturation circuit may be used to detect the voltage across the output circuit, and, when necessary, to shunt excess drive to ground or into the collector of the output circuit. When the output circuit is switched OFF, a fixed current sink may be used to shut OFF the output circuit by sinking current from the base of the output circuit to ground.

This approach, however, has several potential problems. One problem is that the source and sink currents required to drive the output circuit are often excessive under lighter loads. Under such conditions, power is wasted when the output circuit is switched ON by a source circuit to a greater extent than necessary, and when the output circuit is switched OFF by a sink circuit to a greater extent than necessary. In addition, the extra source current supplied by the source circuit under lighter loads may slow the switch OFF time of the source circuit. Because the output circuit will not switch OFF as long as the source circuit is still ON, a delay in switching OFF the source circuit lengthens the switch-OFF period of the output circuit.

Another potential problem with conventional switching circuits is that the sink circuit often must be switched OFF itself before the output circuit can be switched back ON. This also may add extra time delay to the switch-ON period of the output circuit.

One other problem that may occur is that additional circuits may be required to prevent the output circuit from saturating. These circuits, which typically shunt extra drive current to ground, rely on an assumed saturation voltage for reference. Thus, these circuits typically have no compensation for variations in transistor characteristic or load current.

A problem may also exist if the emitter of the output circuit is held above ground during the switch OFF period, and the sink circuit grounds the base of the output circuit. This arrangement can backward bias the emitter-base junction of the output circuit and cause an undesirable leakage path from the emitter of the output circuit through its base to ground via the sink circuit. This leakage can damage the output circuit.

Finally, if the load is short-circuited, the source circuit may be forced to provide maximum drive current. This can cause the output circuit to operate at excessively high currents, potentially causing damage to the output circuit.

SUMMARY OF THE INVENTION

Therefore, it is an object of this invention to provide a switching circuit that conserves power and reduces the switch-OFF time by limiting the excess current provided by the source and sink circuits in the switching circuit.

It is also an object of this invention to provide a switching circuit which reduces the switch-ON period by minimizing delays in switching OFF the sink circuit.

It is also an object of this invention to provide a switching circuit that compensates for variations in transistor characteristics and/or load current.

It is also an object of this invention to provide a switching circuit which is not subject to damage caused by back-biasing of the output circuit emitter-base junction.

It is also an object of this invention to provide a switching circuit which is not subject to damage when the load is short-circuited.

Therefore, switching circuits and techniques including output circuits, switch-ON circuits, switch-OFF circuits and controlled current sources are provided. A single input signal, which is either ON or OFF, is fed to both the switch-ON circuit and the switch-OFF circuit. In response to an ON signal, the switch-ON circuit provides a switch-ON current to initiate the turn-ON of the output circuit. A sample of the output current, e.g. the collector-emitter current in an output transistor acting as the output circuit, is then sampled and fed to the controlled current source which then drives the output circuit to a higher level. At this higher level, the output circuit may be switched fully ON. In response to an OFF signal, the switch-OFF circuit operates to sink drive current away from the output circuit to initiate turn-OFF of the output circuit. A sample of the output current is then fed to the controlled current source which then drives the switch-OFF circuit to a higher level. At this higher level, the switch-OFF circuit is able to fully switch OFF the output circuit.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
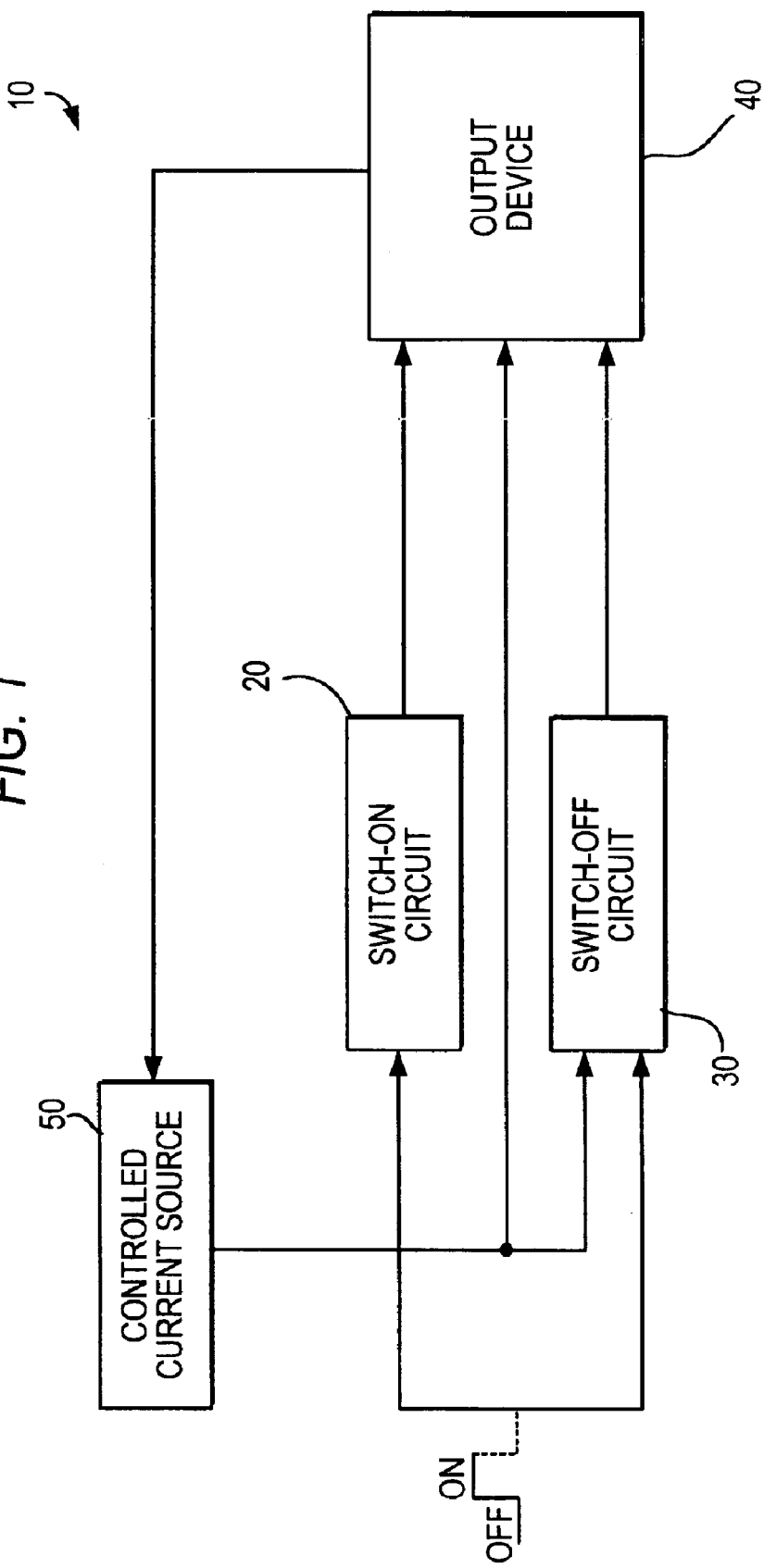
FIG. 1 is a block diagram of a switching circuit according to the principles of the invention.

Circuits and techniques for providing high-speed, load-generated, no quiescent current switching of transistors are provided. These transistors may have floating emitters.

In conventional switching circuits, a switch-ON circuit may be used to drive the base of an output device HIGH, thereby switching ON the output device when the output device has a source of constant current supplying its base-emitter junction. When the output device is ON, an anti-saturation circuit may be used to shunt excess current from the base of the output device to ground. A switch-OFF circuit may be used to sink current from the base of the output device, thereby switching OFF the output device.

However, conventional switching circuits present a number of potential problems, as described above. Many of the problems may involve regulation of the currents in the switch-ON circuit and switch-OFF circuit. A switching circuit constructed according to the invention overcomes these problems by sampling the current provided to the emitter of the output device, and using that sample to regulate and augment the drive currents to the output circuit and the switch-OFF circuit.

A switching circuit according to the principles of the invention operates as follows. First, an input signal is provided to the circuit. The input signal can be either HIGH or LOW (or, in the alternative, ON or OFF) and is generated by any suitable method known in the art of producing a HIGH or LOW input. Generation of such signals is well-known in the art and does not require further explanation. When the input signal is HIGH, current is preferably injected into the base of the output device via the switch-ON circuit. A controlled current source (in one particular embodiment, the controlled current source is a current mirror) then senses the current in the output device, e.g. through the collector-emitter of the output device, and preferably drives the base of the output device even higher. This additional current then fully turns ON the output device.

When the input signal is LOW, current is preferably drawn out of the base of the output device by the switch-OFF device. The controlled current source then senses the current in the output device, and preferably provides additional drive to the switch-OFF circuit which, in turn, draws out even more current from the base of the output device. This additional current drain then turns OFF the output device.

In one aspect of the invention, the switching circuit provides added efficiency because the switch-OFF device does not draw any current once the output device is switched OFF. Therefore, when the input signal is switched ON, the switch-ON circuit can source current immediately into the base of the output device because there are no delays in waiting for the switch-OFF device to stop drawing current.

Another aspect of the invention involves rapidly starting the switch-OFF circuit. When the input signal is switched LOW, the switch-ON circuit is switched OFF. Because the controlled current source, e.g., the current mirror, is already providing current at the transition of the switching circuit from ON to OFF (it was just maintaining the switch-ON circuit in an ON state), the switch-OFF circuit can rapidly switch ON because it is also supplied with current from the controlled current source. Therefore, the switch-OFF circuit can start drawing current from the base of the output device immediately at the onset of the OFF period of the input signal. This provides another saving in circuit efficiency.

Another aspect of the invention is that it maintains the beta of the output device at a pre-determined level. This level is determined by the ratio of the emitter-base junction area of the transistors in the controlled current source to each other and to the output device. By setting the beta of the output device close to the point of saturation, the output device retains only a minimum amount of excess base charge. This reduces shut-OFF time because there is minimal delay attributable to removing excess base charge from the output device.

The beta of the output device is preferably set at some fixed ratio to one of the transistors in the controlled current source. This allows the controlled current source to sample a portion of the current conducted by the output device and use that sample to further drive either the output device or the switch-OFF circuit. In one embodiment, the current in the output transistor is sampled by coupling the emitter and the base of the output transistor to the emitter and base of the transistor in the controlled current source, respectively. The matching between these transistors can be further improved by forcing the collector voltage of the current source transistor to approximately match the collector voltage of the output transistor. This can be accomplished by coupling the respective collectors in a cascode formation, as will be explained.

Another aspect of the invention is that the circuit is arranged in such a fashion that the quiescent current is eliminated in the OFF state. This is because the switch-OFF circuit is driven by a current which is controlled, in one embodiment, by a current from the output device. Therefore, when the output device is completely shut OFF, e.g., after its base is drained, the switch-OFF circuit is also OFF. In addition, if the output transistor begins to leak current, the switch-OFF circuit will be activated to hold the output device OFF.

FIG. 1 shows a block diagram of switching circuit 10 according to the invention. First, operation of this circuit will be described to introduce the concepts of the invention. Then, the invention will be described in more detail with reference to FIGS. 2, 3 and 4.

In FIG. 1, an input signal is fed into both a switch-ON circuit 20 and a switch-OFF circuit 30. The input signal is either HIGH or LOW. When the input signal is HIGH, it turns the switch-ON circuit 20 ON. The switch-ON circuit 20 then provides a current to the output device 40. This current, however, is not sufficient to fully drive output device 10.

At this point, a controlled current source 50 is switched ON because it responds to any current conducted by output device 40. In one embodiment, controlled current source 50 then begins driving additional current into output device 40 directly. This additional current allows output device 40 to be fully turned ON.

When input signal switches OFF, it turns OFF switch-ON circuit 20 and turns ON switch-OFF circuit 30. Switch-OFF circuit 30 promptly begins draining current from the base of output device 40 because controlled current source 50 is already producing sufficient current to drive switch-OFF circuit 30 at a high level. When the base of output device 40 is drained, no current is mirrored to switch-OFF circuit 30, and it turns OFF. Thus, in the OFF state, all transistors in switching circuit 10 are OFF, and switching circuit 10 draws substantially no quiescent current.

Figure 2:
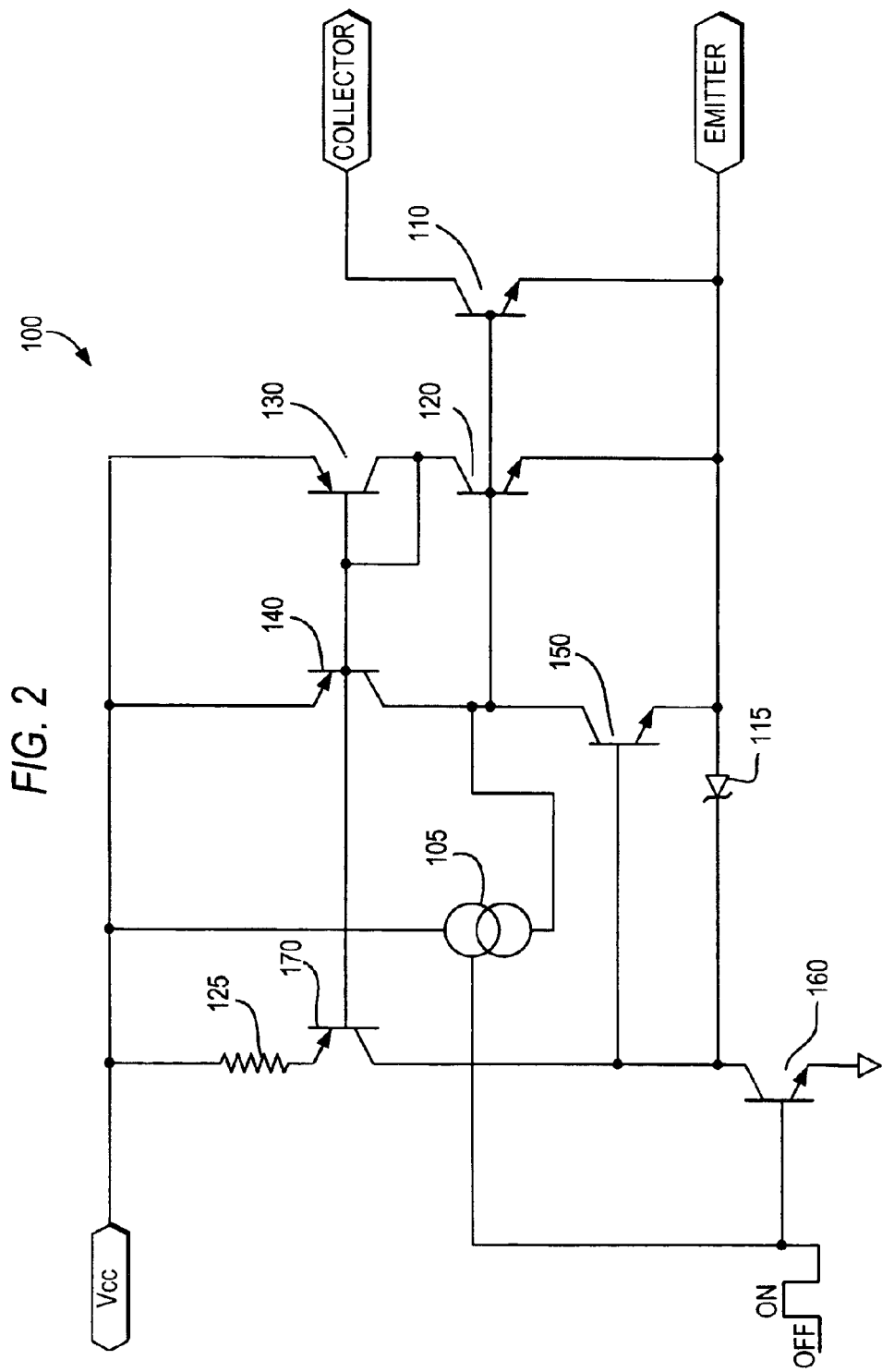
FIG. 2 is a circuit diagram of a switching circuit according to the principles of the invention.

FIG. 2 is a circuit diagram of one embodiment of a switching circuit 100 according to the invention. This circuit is more detailed than the block diagram in FIG. 1, but the principles are essentially the same.

Transistor 110 is a large output device having an emitter that may be, for example, 100 times greater the area than the emitter of transistor 120. It follows that transistor 120 operates at 1/100th the output current conducted through the collector-emitter junction of output transistor 110.

Transistor 120 is part of controlled current source also comprising transistors 120, 130, 140 and 170 which mirrors a current through transistor 120 for use by the rest of the circuit. When the input signal is ON, transistor 140 provides base drive to turn output transistor 110 fully ON. When the input signal is OFF, transistor 170 provides base drive to transistor 150, which, when activated, sinks current from the base of output transistor 110.

Switching circuit 100 operates as follows: when the input signal is turned HIGH, current source 105 is signaled to inject current into output transistor 110's base. This current accomplishes two tasks: first, it slightly turns ON output transistor 110, and second, it initiates operation of controlled current source transistors 120, 130, 140 and 170. Thus, as output transistor 110 begins to turn ON, the controlled current source, comprising transistors 120, 130, 140 and 170, turns on as well.

Additional current provided by transistor 140 then provides base current to output transistor 110 until it is fully ON. Thus, the switch-ON circuit, as mentioned in reference to FIG. 1, may include, for example, as shown in FIG. 2, current source 105. The switch-OFF circuit preferably may include, for example, transistors 150 and 160, and diode 115. The controlled current source may include, for example, transistors 120, 130, 140 and 170, and resistor 125.

When the input signal is HIGH, transistor 160 holds transistor 150's base OFF because transistor 160 drains any current that may be provided by transistor 170. Resistor 125 limits the maximum current transistor 160 has to divert from the base of transistor 150. Schottky diode 115 may be used to prevent transistor 160 from drawing current from the emitter-base junction of transistor 150 when transistor 150 has no base current.

In the preferred embodiment of switching circuit 100, the ratio of transistor 110 to transistor 120, as mentioned above, is 100:1, and the ratio of transistor 130 to transistor 140 is 1:2. (These ratios, as well as all other ratios and values specified in this patent, are only exemplary embodiments of the invention, and are not intended to limit the scope of the invention to the particular values.) Therefore, output transistor 110 has a forced beta of 50 because the current that is provided to its base will always be approximately 1/50 of the current it conducts through its collector-emitter junction. This beta remains constant even when transistor 110 nears saturation, irrespective of load or saturation voltage.

When the input signal is turned OFF, current source 105 and transistor 160 are turned OFF. Because transistor 170 is already sourcing current, transistor 150 switches ON rapidly.

To understand how the invention provides a shortened turn-OFF time, the turn-OFF process for conventional switching circuits should be considered. Typically, the turn-OFF time of an output transistor depends on its prior operating conditions.

As the base drive to a transistor is increased for a given load, the collector-emitter voltage drops. In conventional circuits, this forces the output transistor to have a progressively lower beta. At some beta point, an increase in base drive produces an insignificant reduction in collector-emitter voltage. The output transistor is then saturated. Thereafter, the collector-base capacitance increases rapidly, storing excess charge on the base. This excess charge must be pulled back out of the base before the device will switch OFF, delaying the turn-OFF process of the switching circuit.

The invention overcomes this time delay problem because the forced beta of output transistor 110 operates to keep output transistor 110 just at the point of saturation. Therefore, output transistor 110 has only a minimum amount of excess base charge to remove at turn-OFF. This significantly reduces the turn-OFF time of output transistor 110.

Another advantage of the preferred embodiment of the invention is that because transistor 150 is driven by a controlled current source which is coupled to the base of output transistor 110, transistor 150 will only be driven as long as there is current in output transistor 110. Thus, when output transistor 110 is completely turned OFF, all the other transistors, including the transistors in the switch-OFF circuit, will also be OFF. It follows that this embodiment of the circuit has no quiescent current. This also allows current source 105 to source current immediately to the base of output transistor 110 at turn-ON because there are no delays in waiting for transistor 150 to turn OFF.

Another advantage of this configuration is that if output transistor 110 leaks so as to turn itself back ON, transistor 120 will mirror the leak and activate transistor 150 to hold transistor 110 OFF. Unless disabled, the turn-OFF loop will always dominate the turn-ON loop due to the extra gain from transistor 150.

Additional advantages of the invention are as follows. The circuit can operate with the output device at any voltage between supply and ground because the drive current for the switch-ON circuitry and the switch-OFF circuitry are proportional to the output current, and not to an independent current source. The circuit also requires no saturation reference device or voltage because the beta of the output transistor is fixed at some pre-determined level (the fixed beta also protects the output transistor under high load currents because it does not allow a very high current to be passed through the output transistor but, rather, limits the current in the output transistor to some pre-determined ratio to the base current). Therefore, the circuit does not require anti-saturation circuitry to detect excess drive current at the base of the output transistor and shunt the excess drive current to ground. Additionally, the drive circuit adapts to changing load current and therefore only a relatively small amount of current is lost to ground.

Figure 3:
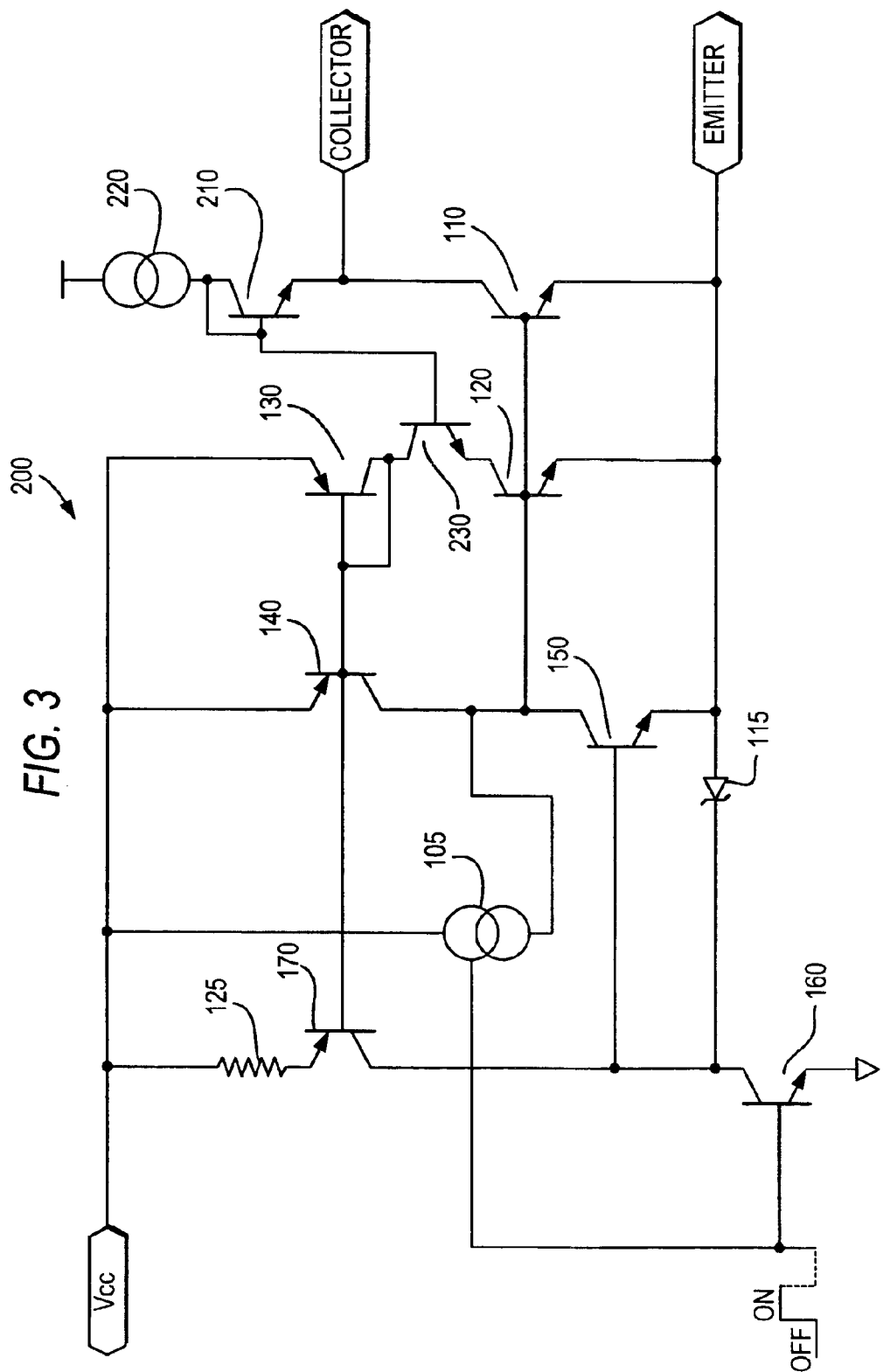
FIG. 3 is a circuit diagram of a switching circuit implementing a cascode configuration according to the principles of the invention.

FIG. 3 shows a switching circuit 200 having a cascode configuration at the connection between the output device and the controlled current source. Reference transistor 210, which is supplied by current source 220, and cascode transistor 230 are configured such that the respective collectors of transistors 110 and 120 are each one $V_{be}$ lower than the base of transistor 210. Thus, in this configuration, the base, emitter and collector of transistor 110 are matched to the base, emitter and collector of transistor 120, respectively. This architecture improves the accuracy of the controlled current source's sampling of the current in the output circuit and, thereby, improves efficiency of the circuit.

Figure 4:
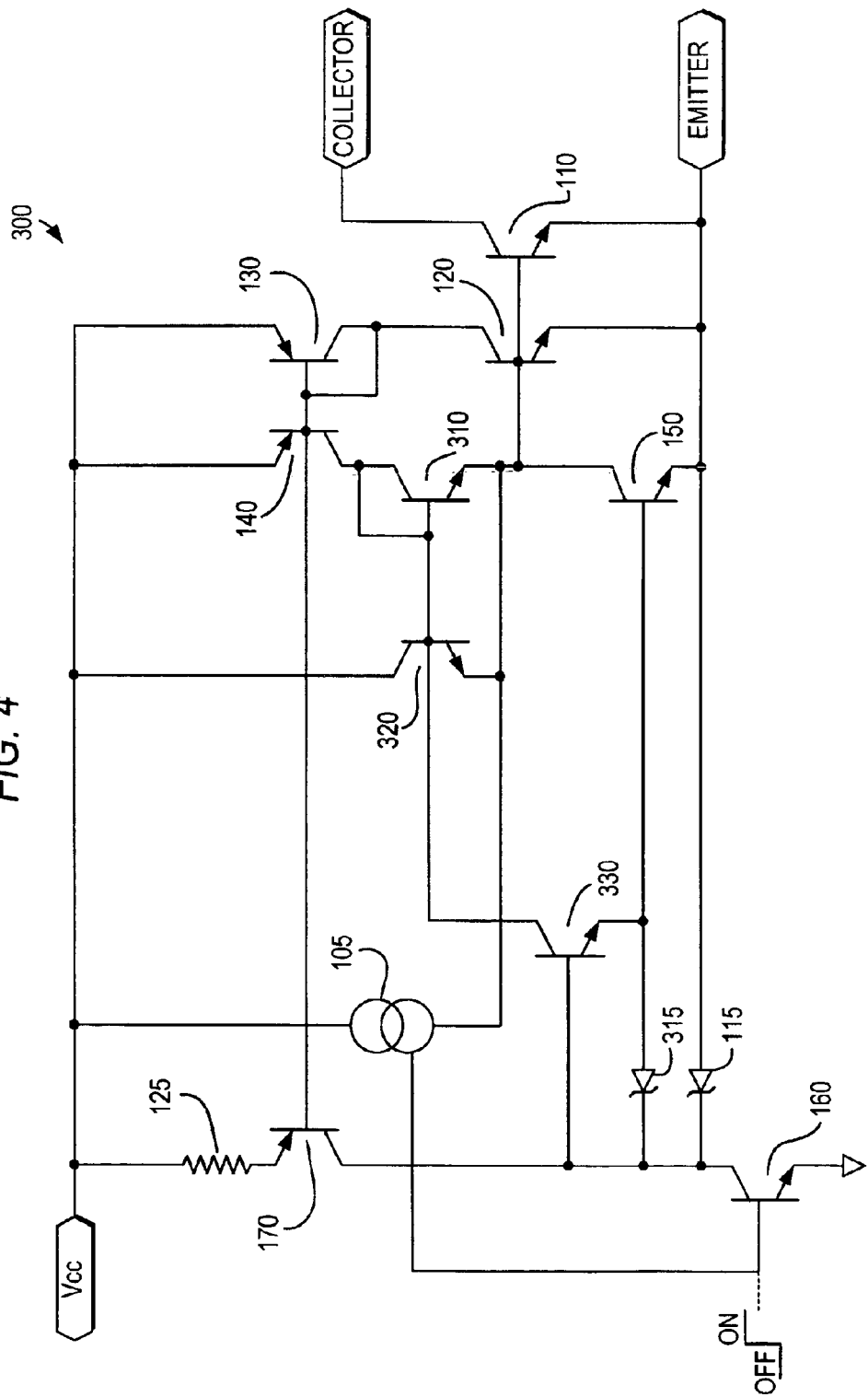
FIG. 4 is a circuit diagram of a switching circuit implementing Darlington configurations according to the present invention.

FIG. 4 shows a switching circuit 300 that expands the approach of the invention to higher current devices requiring Darlington drive stages. In FIG. 4, transistor 320 provides the Darlington drive to the base of output transistor 110, effectively increasing its base current by the emitter ratio of transistor 310 to transistor 320.

In switching circuit 300, the ratio of output transistor 110 to transistor 120 is preferably about 500:1. The ratio of transistor 130 to transistor 140 is preferably 1:1. The ratio of transistor 320 to transistor 310 is preferably 1:10 (transistors 320 and 310 add into the base of transistor 110). These ratios, as in the circuit shown in FIG. 2, force output transistor 110 to have a beta of about 50.

A Darlington structure can also be used in the switch-OFF circuit, as shown in FIG. 4. At turn-OFF, transistor 330 removes current that was driving transistor 320's base and uses it together with transistor 160's current, as provided by is transistor 170, to drive transistor 150. After turn-OFF, no quiescent current is drawn.

Thus it is seen that switching circuits and techniques having load generated drive and substantially no quiescent current for high speed switching of transistors have been provided. Persons skilled in the art will appreciate that the present invention can be practiced by other than the described embodiments, which are presented for purposes of illustration rather than of limitation, and the present invention is limited only by the claims which follow.

What is claimed is:

1. A switching circuit that switches an output circuit, said switching circuit comprising:
   a switch-ON circuit that provides a switch-ON current to said output circuit when an input signal is ON;
   a switch-OFF circuit that operates when said input signal is OFF; and
   a controlled current source coupled to said switch-ON circuit, said switch-OFF circuit, and said output circuit, wherein said controlled current source continually samples, using a current mirror, an output current from said output circuit and provides drive current to said output circuit in proportion to said output current, and provides at least a portion of said drive current to said switch-OFF circuit if said input signal is OFF.

2. The switching circuit of claim 1, wherein said switch-OFF circuit operates to remove said drive current from said output circuit.

3. The switching circuit of claim 1, wherein said output circuit comprises a transistor.

4. The switching circuit of claim 3, wherein a base of said transistor is coupled to be driven by said switch-ON current.

5. The switching circuit of claim 3, wherein a base of said transistor is coupled to be driven by said drive current.

6. The switching circuit of claim 1, wherein said switch-ON circuit comprises a current source coupled to receive said input signal.

7. The switching circuit of claim 1, said controlled current source comprising a first transistor coupled to sample said output current.

8. The switching circuit of claim 7, wherein said output circuit is an output transistor and the ratio of said output transistor to said first transistor is fixed.

9. The switching circuit of claim 1, wherein said controlled current source circuit is configured to supply substantially no current to said switch-ON circuit and substantially no current to said switch-OFF circuit when said output current is substantially zero.

10. A method for using a switching circuit to switch an output circuit, said switching circuit comprising a switch-ON circuit, a switch-OFF circuit and a controlled current source, said method comprising:
    providing an input signal to said switch-ON circuit and to said switch-OFF circuit;
    when said input signal is ON, said switch-ON circuit providing a switch-ON current to said output circuit;
    when said input signal is OFF, operating said switch-OFF circuit;
    using said controlled current source to continually sample, using a current mirror, an output current conducted by said output circuit;
    providing a drive current from said controlled current source to said output circuit when said input signal is ON and providing at least a portion of said drive current to said switch-OFF circuit when said input signal is OFF, said drive current being proportional to said output current.

11. The method of claim 10 wherein said providing a switch-ON current comprises providing said switch-ON current to a base of a transistor in said output circuit.

12. The method of claim 10 wherein said providing a drive current comprises amplifying a sample of said output current to provide said drive current.

13. The method of claim 10 further comprising preventing an undesired turn-ON of said switch-OFF circuit.

14. The method of claim 10 wherein said providing drive current comprises providing a substantially zero current when said input signal and said output current are substantially zero.

15. A switching circuit to switch an output circuit, said switching circuit comprising a switch-ON circuit, a switch-OFF circuit and a controlled current source, said switching circuit further comprising:
    a means for providing an input signal to said switch-ON circuit and to said switch-OFF circuit;
    when said input signal is ON, a means for providing a switch-ON current from said switch-ON circuit to said output circuit;
    when said input signal is OFF, a means for operating said switch-OFF circuit;
    a means for using said controlled current source to continually sample, using a current mirror, an output current conducted by said output circuit;
    a means for providing a drive current from said controlled current source to said output circuit when said input signal is ON and providing at least a portion of said drive current to said switch-OFF circuit when said input signal is OFF, said drive current being proportional to said output current.

16. The switching circuit of claim 15 wherein said means for providing a switch-ON current is comprised to a base of a transistor in said output circuit.

17. The switching circuit of claim 15 wherein said means for providing a drive current comprises a means for amplifying a sample of said output current to provide said drive current.

18. The switching circuit of claim 15 wherein said means for operating said switch-OFF circuit comprises a means for preventing the undesired turn-ON of said switch-OFF circuit.

19. The switching circuit of claim 15 wherein said means for providing a drive current is configured to allow said drive current to be conducted at a fixed ratio to said output current.

20. The switching circuit of claim 15 wherein said means for providing a drive current comprises a means for providing substantially zero current when input signal is OFF and said switch-OFF circuit is conducting substantially no current.

21. A switching circuit that switches an output circuit, said switching circuit comprising:
    a switch-ON circuit that provides a switch-ON current to said output circuit when an input signal is ON;
    a switch-OFF circuit that operates when said input signal is OFF; and
    a controlled current source comprising a current mirror, the controlled current source coupled to said switch-ON circuit, said switch-OFF circuit, and said output circuit, wherein, when said input signal is ON, said controlled current source continually provides drive current to said output circuit in proportion to said output current, the proportionality being derived using the current mirror and provides at least a portion of said drive current to said switch-OFF circuit if said input signal is OFF.

22. The switching circuit of claim 21, wherein said switch-OFF circuit operates to remove said drive current from said output circuit.

23. The switching circuit of claim 21, wherein said output circuit comprises a transistor.

24. The switching circuit of claim 23, wherein a base of said transistor is coupled to be driven by said switch-ON current.

25. The switching circuit of claim 23, wherein a base of said transistor is coupled to be driven by said drive current.

26. The switching circuit of claim 21, wherein said switch-ON circuit comprises a current source coupled to receive said input signal.

27. The switching circuit of claim 21, wherein said controlled current source circuit is configured to supply substantially no current to said switch-ON circuit and substantially no current to said switch-OFF circuit when said output current is substantially zero.

28. A method for using a switching circuit to switch an output circuit, said switching circuit comprising a switch-ON circuit, a switch-OFF circuit and a controlled current source, said method comprising:
provide an input signal to said switch-ON circuit and to said switch-OFF circuit;
when said input signal is ON, said switch-ON circuit providing a switch-ON current to said output circuit;
when said input signal is OFF, operating said switch-OFF circuit;
continually providing a drive current from said controlled current source to said output circuit when said input signal is ON and providing at least a portion of said drive current to said switch-OFF circuit when said input signal is OFF, said drive current being proportional to said output current, the proportionality being derived using a current mirror.

29. The method of claim 28 wherein said providing a switch-ON current comprises providing said switch-ON current to a base of a transistor in said output circuit.

30. The method of claim 28 wherein said providing a drive current comprises amplifying a sample of said output current to provide said drive current.

31. The method of claim 28 further comprising preventing an undesired turn-ON of said switch-OFF circuit.

32. The method of claim 28 wherein said providing a drive current comprises providing substantially zero current when said input signal and said output current are substantially zero.

33. A switching circuit to switch an output circuit, said switching circuit comprising a switch-ON circuit, a switch-OFF circuit and a controlled current source, said switching circuit comprising:
a means for providing an input signal to said switch-ON circuit and to said switch-OFF circuit;
when said input signal is ON, a means for providing a switch-ON current from said switch-ON circuit to said output circuit;
when said input signal is OFF, a means for operating said switch-OFF circuit;
a means for continually providing a drive current from said controlled current source to said output circuit when said input signal is ON and providing at least a portion of said drive current to said switch-OFF circuit when said input signal is OFF, said drive current being proportional to said output current, the proportionality being derived using a current mirror.

34. The switching circuit of claim 33 wherein said means for providing a switch-ON current is coupled to a base of a transistor in said output circuit.

35. The switching circuit of claim 33 wherein said means for providing a drive current comprises a means for amplifying a sample of said output current to provide said drive current.

36. The switching circuit of claim 33 wherein said means for operating said switch-OFF circuit comprises a means for preventing the undesired turn-ON of said switch-OFF circuit.

37. The switching circuit of claim 33 wherein said means for providing a drive current is configured to allow said drive current to be conducted at a fixed ratio to said output current.

38. The switching circuit of claim 33 wherein said means for providing a current comprises a means for providing substantially zero current when input signal is OFF and said switch-OFF circuit is conducting substantially no current.

39. A switching circuit that switches an output circuit, said switching circuit comprising:
a switch-ON circuit that provides a switch-ON current to said output circuit when an input signal is ON;
a switch-OFF circuit that operates when said input signal is OFF; and
a controlled current source coupled to said switch-ON circuit, said switch-OFF circuit, and said output circuit, wherein said controlled current source continually mirrors an output current, using a current mirror, from said output circuit and provides drive current to said output circuit in proportion to said output current, and provides at least a portion of said drive current to said switch-OFF circuit if said input signal is OFF.

40. The switching circuit of claim 39, wherein said switch-OFF circuit operates to remove said drive current from said output circuit.

41. The switching circuit of claim 39, wherein said output circuit comprises a transistor.

42. The switching circuit of claim 41, wherein a base of said transistor is coupled to be driven by said switch-ON current.

43. The switching circuit of claim 41, wherein a base of said transistor is coupled to be driven by said drive current.

44. The switching circuit of claim 39, wherein said switch-ON circuit comprises a current source coupled to receive said input signal.

45. The switching circuit of claim 39, said controlled current source comprising a first transistor coupled to mirror said output current.

46. The switching circuit of claim 45, wherein said output circuit is an output transistor and the ratio of said output transistor to said first transistor is fixed.

47. The switching circuit of claim 39, wherein said controlled current source circuit is configured to supply substantially no current to said switch-ON circuit and substantially no current to said switch-OFF circuit when said output current is substantially zero.

48. A method for using a switching circuit to switch an output circuit, said switching circuit comprising a switch-ON circuit, a switch-OFF circuit and a controlled current source, said method comprising:
providing an input signal to said switch-ON circuit and to said switch-OFF circuit;
when said input signal is ON, said switch-ON circuit providing a switch-ON current to said output circuit;
when said input signal is OFF, operating said switch-OFF circuit;
using said controlled current source to continually mirror an output current, using a current mirror, conducted by said output circuit;
providing a drive current from said controlled current source to said output circuit when said input signal is ON and providing at least a portion of said drive current to said switch-OFF circuit when said input signal is OFF, said drive current being proportional to said output current.

49. The method of claim 48 wherein said providing a switch-ON current comprises providing said switch-ON current to a base of a transistor in said output circuit.

50. The method of claim 48 wherein said providing a drive current comprises amplifying a mirrored current of said output current to provide said drive current.

51. The method of claim 48 further comprising preventing an undesired turn-ON of said switch-OFF circuit.

52. The method of claim 48 wherein said providing a drive current comprises providing substantially zero current when said input signal and said output current are substantially zero.

53. A switching circuit to switch an output circuit, said switching circuit comprising a switch-ON circuit, a switch-OFF circuit and a controlled current source, said switching circuit comprising:

a means for providing an input signal to said switch-ON circuit and to said switch-OFF circuit;

when said input signal is ON, a means for providing a switch-ON current from said switch-ON circuit to said output circuit;

when said input signal is OFF, a means for operating said switch-OFF circuit;

a means for using said controlled current source to continually mirror, using a current mirror, an output current conducted by said output circuit;

a means for providing a drive current from said controlled current source to said output circuit when said input signal is ON and providing at least a portion of said drive current to said switch-OFF circuit when said input signal is OFF, said drive current being proportional to said output current.

54. The switching circuit of claim 53 wherein said means for providing a switch-ON current is coupled to a base of a transistor in said output circuit.

55. The switching circuit of claim 53 wherein said means for providing a drive current comprises a means for amplifying a mirrored current of said output current to provide said drive current.

56. The switching circuit of claim 53 wherein said means for operating said switch-OFF circuit comprises a means for preventing the undesired turn-ON of said switch-OFF circuit.

57. The switching circuit of claim 53 wherein said means for providing a drive current is configured to allow said drive current to be conducted at a fixed ratio to said output current.

58. The switching circuit of claim 53 wherein said means for providing a drive current comprises a means for providing substantially zero current when input signal is OFF and said switch-Off circuit is conducting substantially no current.

* * * * *